United States Patent
Lyu et al.

(10) Patent No.: US 10,637,610 B2
(45) Date of Patent: Apr. 28, 2020

(54) INFORMATION SENDING METHOD AND APPARATUS, AND INFORMATION RECEIVING METHOD AND APPARATUS

(71) Applicant: Huawei Technologies Co., Ltd., Shenzhen (CN)

(72) Inventors: Yongxia Lyu, Ottawa (CA); Lei Guan, Beijing (CN); Zhiyu Yan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 133 days.

(21) Appl. No.: 15/780,460

(22) PCT Filed: Jul. 20, 2015

(86) PCT No.: PCT/CN2015/084490
§ 371 (c)(1),
(2) Date: May 31, 2018

(87) PCT Pub. No.: WO2017/011980
PCT Pub. Date: Jan. 26, 2017

(65) Prior Publication Data
US 2019/0020442 A1 Jan. 17, 2019

(51) Int. Cl.
*H04L 1/00* (2006.01)
*H03M 13/09* (2006.01)
(Continued)

(52) U.S. Cl.
CPC .......... *H04L 1/0061* (2013.01); *H03M 13/09* (2013.01); *H03M 13/356* (2013.01);
(Continued)

(58) Field of Classification Search
CPC ... H04L 1/0061; H04L 1/1671; H04L 1/1812; H04L 5/0055; H04L 1/00; H04B 7/0639;
(Continued)

(56) References Cited

U.S. PATENT DOCUMENTS 6,085,349 A * 7/2000 Stein .................... H03M 13/09
714/778
8,149,835 B2 4/2012 Kim et al.
(Continued)

FOREIGN PATENT DOCUMENTS

CN 101034952 A 9/2007
CN 101277509 A 10/2008
(Continued)

OTHER PUBLICATIONS

"3rd Generation Partnership Project;Technical Specification Group Radio Access Network; Evolved Universal Terrestrial Radio Access (E-UTRA);Multiplexing and channel coding(Release 12)," 3GPP TS 36.212 V12.1.0, 3rd Generation Partnership Project, Valbonne, France (Jun. 2014).
(Continued)

*Primary Examiner* — Curtis A Alia
(74) *Attorney, Agent, or Firm* — Leydig, Voit & Mayer, Ltd.

(57) ABSTRACT

Embodiments of the present invention provide an information sending method and apparatus and an information receiving method and apparatus. The sending method includes: determining a length of a cyclic redundancy check CRC code based on a length of first information, where the first information is control information, and if the length of the first information is less than or equal to a first threshold, and greater than a second threshold, it is determined that the length of the CRC code is a first length; generating the CRC code based on a generator polynomial corresponding to the length of the CRC code and the first information; generating second information; and sending the second information. The present invention improves reliability of information transmission.

19 Claims, 3 Drawing Sheets

(51) Int. Cl.
*H03M 13/00* (2006.01)
*H03M 13/35* (2006.01)
*H04L 1/16* (2006.01)
*H04B 7/06* (2006.01)
*H04L 1/18* (2006.01)
*H04L 5/00* (2006.01)

(52) U.S. Cl.
CPC ... *H03M 13/6516* (2013.01); *H03M 13/6525* (2013.01); *H04B 7/0626* (2013.01); *H04B 7/0639* (2013.01); *H04L 1/00* (2013.01); *H04L 1/1671* (2013.01); *H04L 1/1812* (2013.01); *H04L 5/0055* (2013.01)

(58) Field of Classification Search
CPC ............ H04B 7/0626; H03M 13/6525; H03M 13/6516; H03M 13/356; H03M 13/09
See application file for complete search history.

(56) References Cited

U.S. PATENT DOCUMENTS

| | | | |
|---|---|---|---|
| 2004/0010743 A1* | 1/2004 | Lee | H03M 13/09 714/748 |
| 2007/0297451 A1 | 12/2007 | Kim et al. | |
| 2010/0070839 A1* | 3/2010 | Shigihara | H03M 13/091 714/807 |
| 2013/0077593 A1 | 3/2013 | Han et al. | |
| 2013/0322398 A1 | 12/2013 | Jang et al. | |
| 2018/0006791 A1* | 1/2018 | Marinier | H04L 1/0026 |

FOREIGN PATENT DOCUMENTS

| | | |
|---|---|---|
| CN | 101471924 A | 7/2009 |
| CN | 102934384 A | 2/2013 |
| CN | 103716130 A | 4/2014 |
| EP | 2579491 A2 | 4/2013 |
| WO | 2009156798 A1 | 12/2009 |
| WO | 2014092502 A1 | 6/2014 |

OTHER PUBLICATIONS

"New PUCCH format(s) for up to 32 CCs",3GPP TSG RAN WG1 Meeting #81 R1-152568, 3rd Generation Partnership Project, Valbonne, France (May 25-29, 2015).

"HARQ ACK for up to 32 DL Carriers",3GPP TSG RAN WG1 #81 R1-152775, 3rd Generation Partnership Project, Valbonne, France (May 25-29, 2015).

"CRC size for Stand-alone Scheduling Information",3GPP TSG-RAN-WG2 Meeting #44,Shanghai, China, XP050596087 R1-061408, 3rd Generation Partnership Project, Valbonne, France (May 8-12, 2006).

* cited by examiner

INFORMATION SENDING METHOD AND APPARATUS, AND INFORMATION RECEIVING METHOD AND APPARATUS

CROSS-REFERENCE TO RELATED APPLICATIONS

This application is a National Stage of International Application No. PCT/CN2015/084490, filed on Jul. 20, 2015, which is hereby incorporated by reference in its entirety.

TECHNICAL FIELD

Embodiments of the present invention relate to communications technologies, and in particular, to an information sending method and apparatus and an information receiving method and apparatus.

BACKGROUND

With development of communications technologies, in a Long Term Evolution (LTE for short) system, when user equipment (UE for short) and an evolved NodeB (eNB for short) transmit information, reliable information transmission is implemented by adding a check code to original information that needs to be transmitted.

In the prior art, a transmit end adds check bits having a fixed length to original information by using a cyclic redundancy check code (CRC for short) technology, and then sends the information with the added check bits to a receive end. After receiving the information with the added check bits, the receive end performs a CRC check, and if the check succeeds, considers that the transmission is correct.

However, if the method in the prior art is used, a possibility still exists that an error occurs in transmission of the original information even though the check at the receive end succeeds. Therefore, if the foregoing method is used, information transmission is not very reliable.

SUMMARY

Embodiments of the present invention provide an information sending method and apparatus and an information receiving method and apparatus, to improve reliability of information transmission.

According to a first aspect, an embodiment of the present invention provides an information sending method, including:

determining a length of a cyclic redundancy check, CRC, code based on a length of first information, where the first information is control information, and if the length of the first information is less than or equal to a first threshold, it is determined that the length of the CRC code is a first length, or if the length of the first information is less than or equal to a first threshold and greater than a second threshold, it is determined that the length of the CRC code is a first length;

generating the CRC code based on a generator polynomial corresponding to the length of the CRC code and the first information;

generating second information, where the second information includes the first information and the CRC code; and sending the second information.

With reference to the first aspect, in a first possible implementation of the first aspect, the first length satisfies $2^{L-1}-1-L>A$, where L is the first length, and A is the length of the first information.

With reference to the first aspect or the first possible implementation of the first aspect, in a second possible implementation of the first aspect, the first length is 8 bits, and the first threshold is 119.

With reference to the first aspect, in a third possible implementation of the first aspect, the first threshold is less than or equal to $2^{L-1}-1-L$, and L is the first length.

With reference to the third possible implementation of the first aspect, in a fourth possible implementation of the first aspect, the first threshold is preset or received in advance.

With reference to the third or the fourth possible implementation of the first aspect, in a fifth possible implementation of the first aspect, the first length is 8 bits, and the first threshold is less than or equal to 119.

With reference to any one of the first aspect, or the first to the fifth possible implementations of the first aspect, in a sixth possible implementation of the first aspect, the determining a length of a cyclic redundancy check, CRC, code based on a length of first information includes:

if the length of the first information is greater than the first threshold, determining that the length of the CRC code is a second length, where a value of the second length is greater than a value of the first length.

With reference to the sixth possible implementation of the first aspect, in a seventh possible implementation of the first aspect, the second length is 16 bits.

With reference to any one of the first aspect, or the first to the seventh possible implementations of the first aspect, in an eighth possible implementation of the first aspect, the second threshold is preset or received in advance.

With reference to the eighth possible implementation of the first aspect, in a ninth possible implementation of the first aspect, the second threshold is 22 or 11.

With reference to any one of the first aspect, or the first to the ninth possible implementations of the first aspect, in a tenth possible implementation of the first aspect, the first information is uplink control signaling.

With reference to the tenth possible implementation of the first aspect, in an eleventh possible implementation of the first aspect, the first information includes any one or any combination of the following:

hybrid automatic repeat request-acknowledgment, HARQ-ACK, signaling;

an uplink scheduling request indicator, SRI; and channel state information, CSI.

According to a second aspect, an embodiment of the present invention provides an information receiving method, including:

receiving second information, where the second information includes first information and a cyclic redundancy check, CRC, code, and the first information is control information;

determining a length of the CRC code based on a length of the first information, where if the length of the first information is less than or equal to a first threshold, it is determined that the length of the CRC code is a first length, or if the length of the first information is less than or equal to a first threshold and greater than a second threshold, it is determined that the length of the CRC code is a first length; and checking the first information based on a generator polynomial corresponding to the length of the CRC code.

With reference to the second aspect, in a first possible implementation of the second aspect, the first length satisfies $2^{L-1}-1-L>A$, where L is the first length, and A is the length of the first information.

With reference to the second aspect or the first possible implementation of the second aspect, in a second possible implementation of the second aspect, the first length is 8 bits, and the first threshold is 119.

With reference to the second aspect, in a third possible implementation of the second aspect, the first threshold is less than or equal to $2^{L-1}-1-L$, and L is the first length.

With reference to the third possible implementation of the second aspect, in a fourth possible implementation of the second aspect, the first threshold is preset or received in advance.

With reference to the third or the fourth possible implementation of the second aspect, in a fifth possible implementation of the second aspect, the first length is 8 bits, and the first threshold is less than or equal to 119.

With reference to any one of the second aspect, or the first to the fifth possible implementations of the second aspect, in a sixth possible implementation of the second aspect, the determining a length of the cyclic redundancy check, CRC, code based on a length of the first information includes:

if the length of the first information is greater than the first threshold, determining that the length of the CRC code is a second length, where a value of the second length is greater than a value of the first length.

With reference to the sixth possible implementation of the second aspect, in a seventh possible implementation of the second aspect, the second length is 16 bits.

With reference to any one of the second aspect, or the first to the seventh possible implementations of the second aspect, in an eighth possible implementation of the second aspect, the second threshold is preset or received in advance.

With reference to the eighth possible implementation of the second aspect, in a ninth possible implementation of the second aspect, the second threshold is 22 or 11.

With reference to any one of the second aspect, or the first to the ninth possible implementations of the second aspect, in a tenth possible implementation of the second aspect, the first information is uplink control signaling.

With reference to the tenth possible implementation of the second aspect, in an eleventh possible implementation of the second aspect, the first information includes any one or any combination of the following:

hybrid automatic repeat request-acknowledgment, HARQ-ACK, signaling;

an uplink scheduling request indicator, SRI; and channel state information, CSI.

According to a third aspect, an embodiment of the present invention provides an information sending apparatus, including:

a processing module, configured to determine a length of a cyclic redundancy check CRC code based on a length of first information, where the first information is control information, and if the length of the first information is less than or equal to a first threshold, it is determined that the length of the CRC code is a first length, or if the length of the first information is less than or equal to a first threshold and greater than a second threshold, it is determined that the length of the CRC code is a first length;

the processing module is further configured to generate the CRC code based on a generator polynomial corresponding to the length of the CRC code and the first information; and the processing module is further configured to generate second information, where the second information includes the first information and the CRC code; and a sending module, configured to send the second information generated by the processing module.

With reference to the third aspect, in a first possible implementation of the third aspect, the first length satisfies $2^{L-1}-1-L>A$, where L is the first length, and A is the length of the first information.

With reference to the third aspect or the first possible implementation of the third aspect, in a second possible implementation of the third aspect, the first length is 8 bits, and the first threshold is 119.

With reference to the third aspect, in a third possible implementation of the third aspect, the first threshold is less than or equal to $2^{L-1}-1-L$, and L is the first length.

With reference to the third possible implementation of the third aspect, in a fourth possible implementation of the third aspect, the first threshold is preset or received in advance.

With reference to the third or the fourth possible implementation of the third aspect, in a fifth possible implementation of the third aspect, the first length is 8 bits, and the first threshold is less than or equal to 119.

With reference to any one of the third aspect, or the first to the fifth possible implementations of the third aspect, in a sixth possible implementation of the third aspect, the processing module is further configured to:

if the length of the first information is greater than the first threshold, determine that the length of the CRC code is a second length, where a value of the second length is greater than a value of the first length.

With reference to the sixth possible implementation of the third aspect, in a seventh possible implementation of the third aspect, the second length is 16 bits.

With reference to any one of the third aspect, or the first to the seventh possible implementations of the third aspect, in an eighth possible implementation of the third aspect, the second threshold is preset or received in advance.

With reference to the eighth possible implementation of the third aspect, in a ninth possible implementation of the third aspect, the second threshold is 22.

With reference to any one of the third aspect, or the first to the ninth possible implementations of the third aspect, in a tenth possible implementation of the third aspect, the first information is uplink control signaling.

With reference to the tenth possible implementation of the third aspect, in an eleventh possible implementation of the third aspect, the first information includes any one or any combination of the following:

hybrid automatic repeat request-acknowledgment, HARQ-ACK, signaling;

an uplink scheduling request indicator, SRI; and channel state information, CSI.

According to a fourth aspect, an embodiment of the present invention provides an information receiving apparatus, including:

a receiving module, configured to receive second information, where the second information includes first information and a cyclic redundancy check, CRC, code, and the first information is control information; and a processing module, configured to determine a length of the CRC code based on a length of the first information in the second information received by the receiving module, where if the length of the first information is less than or equal to a first threshold, it is determined that the length of the CRC code is a first length, or if the length of the first information is less than or equal to a first threshold and greater than a second threshold, it is determined that the length of the CRC code is a first length; and the processing module is further configured to check the first information based on a generator polynomial corresponding to the length of the CRC code.

With reference to the fourth aspect, in a first possible implementation of the fourth aspect, the first length satisfies $2^{L-1}1-L>A$, where L is the first length, and A is the length of the first information.

With reference to the fourth aspect or the first possible implementation of the fourth aspect, in a second possible implementation of the fourth aspect, the first threshold is 119.

With reference to the fourth aspect, in a third possible implementation of the fourth aspect, the first threshold is less than or equal to $2^{L-1}1-L$, and L is the first length.

With reference to the third possible implementation of the fourth aspect, in a fourth possible implementation of the fourth aspect, the first threshold is preset or received in advance.

With reference to the third possible implementation of the fourth aspect or the fourth possible implementation of the fourth aspect, in a fifth possible implementation of the fourth aspect, the first length is 8 bits, and the first threshold is less than or equal to 119.

With reference to any one of the fourth aspect, or the first to the fifth possible implementations of the fourth aspect, in a sixth possible implementation of the fourth aspect, the processing module is further configured to:

if the length of the first information is greater than the first threshold, determine that the length of the CRC code is a second length, where a value of the second length is greater than a value of the first length.

With reference to the sixth possible implementation of the fourth aspect, in a seventh possible implementation of the fourth aspect, the second length is 16 bits.

With reference to any one of the fourth aspect, or the first to the seventh possible implementations of the fourth aspect, in an eighth possible implementation of the fourth aspect, the second threshold is preset or received in advance.

With reference to the eighth possible implementation of the fourth aspect, in a ninth possible implementation of the fourth aspect, the second threshold is 22.

With reference to any one of the fourth aspect, or the first to the ninth possible implementations of the fourth aspect, in a tenth possible implementation of the fourth aspect, the first information is uplink control signaling.

With reference to the tenth possible implementation of the fourth aspect, in an eleventh possible implementation of the fourth aspect, the first information includes any one or any combination of the following:

hybrid automatic repeat request-acknowledgment, HARQ-ACK, signaling;

an uplink scheduling request indicator, SRI; and channel state information, CSI.

Based on the information sending method and apparatus and the information receiving method and apparatus provided in the embodiments of the present invention, the length of the CRC code is determined based on the length of the first information, where the first information is the control information, and if the length of the first information is less than or equal to the first threshold, it is determined that the length of the CRC code is the first length, or if the length of the first information is less than or equal to the first threshold and greater than the second threshold, it is determined that the length of the CRC code is the first length; the CRC code is generated based on the generator polynomial corresponding to the length of the CRC code and the first information; the second information is generated, where the second information includes the first information and the CRC code; and the second information is sent. It may be learned that in the embodiments, the length of the CRC code for performing CRC encoding is determined based on a length of the control information, and the length of the CRC code is determined by comparing the length of the first information with a value of the first threshold or by comparing the length of the first information with values of the first threshold and the second threshold, thereby avoiding a possibility that an error occurs in information transmission even though a CRC check succeeds after a receive end receives information, and improving reliability of information transmission.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by persons of ordinary skill in the art based on the embodiments of the present invention without creative efforts shall fall within the protection scope of the present invention.

Information sending and receiving methods provided in the present invention can be applied to a scenario in which UE and an eNB transmit information. The information sending method includes: determining a length of a CRC code based on a length of first information; generating the CRC code based on a generator polynomial corresponding to the length of the CRC code and the first information; generating second information, where the second information includes the first information and the CRC code; and sending the second information. When CRC encoding is performed on to-be-transmitted information, based on a length of the to-be-transmitted information, a quantity of bits of the to-be-transmitted information on which CRC encoding is performed and a corresponding generator polynomial are determined, thereby improving reliability of information transmission.

In the embodiments of the present invention, the first information is control information, and may be common control information content transmitted on an uplink or downlink, such as hybrid automatic repeat request-acknowledgment (HARQ-ACK for short) signaling, an uplink scheduling request indicator (SRI for short), or channel state information (CSI for short). This is not limited in the present invention.

The following describes the technical solutions of the present invention in detail by using specific embodiments. The following specific embodiments may be combined, and same or similar concepts or processes may not be repeatedly described in some embodiments.

Figure 1:
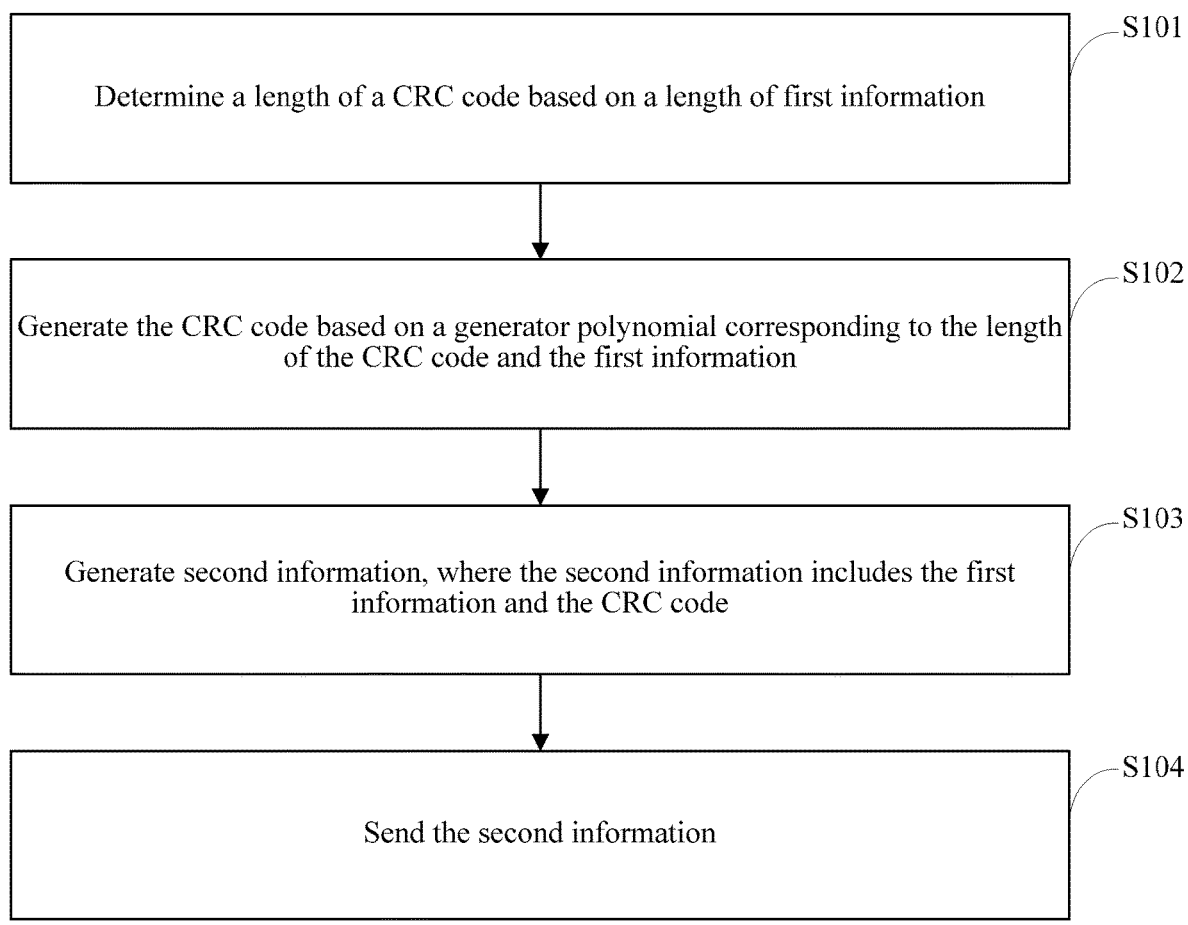
FIG. 1 is a schematic flowchart of an embodiment of an information sending method according to the embodiments of the present invention.

FIG. 1 is a schematic flowchart of an embodiment of an information sending method according to the embodiments of the present invention. As shown in FIG. 1, the information sending method according to this embodiment includes the following steps.

S101: Determine a length of a CRC code based on a length of first information.

The first information is control information. If the length of the first information is less than or equal to a first threshold, it is determined that the length of the CRC code is a first length, or if the length of the first information is less than or equal to a first threshold and greater than a second threshold, it is determined that the length of the CRC code is a first length.

For example, this embodiment is implemented by an information transmit end. If the method is used in an uplink information transmission process, the method may be performed by a UE or another terminal. If the method is used in a downlink information transmission process, the method may be performed by a base station or another network element device. In an example in which the method is performed by a UE, the first information is control information sent by the information transmit end. The length of the first information may be determined according to a rule agreed between the transmit end and a receive end. For example, when the UE sends uplink control signaling to a receive end eNB, the eNB notifies, according to the agreed rule, the UE of a quantity of bits of information needing to be sent.

In an implementation, the determining, by a transmit end, a length of a CRC code based on a length of first information includes: if the length of the first information is less than or equal to the first threshold, determining that the length of the CRC code is the first length. In another implementation, the determining, by a transmit end, a length of a CRC code based on a length of first information includes: if the length of the first information is less than or equal to the first threshold and greater than the second threshold, determining that the length of the CRC code is the first length.

In either of the foregoing implementations, the first length satisfies $2^{L-1}-1-L > A$, where L is the first length, and A is the length of the first information. For example, the first length is 8 bits, and the first threshold is 119 bits. In this case, if the length of the first information is less than or equal to 119, it is determined that the length of the CRC code is the first length, namely, 8 bits.

In another implementation, the first threshold is less than or equal to $2^{L-1}-1-L$, and L is the first length. For example, when the first length is 8 bits, the first threshold is less than or equal to 119, that is, the first threshold may be 119 or any value less than 119. The first threshold is preset or received in advance. For example, the first threshold may be preset by the information transmit end and the information receive end, or may be received by the transmit end in advance from the receive end, or may be received by the transmit end and the receive end in advance from another network element.

The second threshold is preset or received in advance. For example, the second threshold may be preset by the information transmit end and the information receive end, or may be received by the transmit end in advance from the receive end, or may be received by the transmit end and the receive end in advance from another network element. Optionally, a value of the second threshold may be determined based on some existing values. For example, the value of the second threshold may be selected as 22 in consideration of not affecting an existing protocol such as a largest quantity of bits supported by a physical uplink control channel (PUCCH for short) format. That is, the first length is 8 bits, and the first threshold is 119. In this case, if the length of the first information is less than or equal to 119 and greater than 22, the first information is encoded using the CRC code having the first length, namely, 8 bits.

Optionally, if the length of the first information is less than or equal to 22, CRC encoding is not performed on the first information.

The length of the first information may alternatively be determined by the transmit end based on an air interface resource, and the receive end is notified of a length of to-be-received information using control signaling, so that the receive end selects a generator polynomial for the length that is of the CRC code and that corresponds to the length of the information, to perform a CRC check. Alternatively, the length of the first information may be determined by the receive end, and the transmit end is notified of a length of to-be-sent information using control signaling, so that the transmit end selects a CRC code corresponding to the length of the information to attach the CRC code. In this way, because the receive end has learned of the length of the first information, when receiving the second information, the receive end can directly determine a length of the CRC code using the length of the first information that the receive end has learned of.

Whether the transmit end and the receive end learn of the length of the first information through an agreement, or through a notification or in another manner in a transmission process is not limited in the present invention provided that the length of the first information determined by the transmit end is the same as the length of the first information determined by the receive end.

S102: Generate the CRC code based on a generator polynomial corresponding to the length of the CRC code and the first information.

For example, different lengths of the CRC code correspond to different generator polynomials. Based on the length of the CRC code determined in S101, the generator polynomial corresponding to the length of the CRC code is selected, and the CRC code is generated based on the generator polynomial and the first information. The generator polynomial of the CRC code is agreed between the information transmit end and the information receive end in advance.

The first information is represented by $B(D) = a_0 D^{A-1} + a_1 D^{A-2} + \ldots + a_{A-1}$, and a sequence representation manner of the first information is $(a_0, a_1, a_2, a_3, \ldots, a_{A-1})$. A generator polynomial of an L-bit CRC code is represented by $g_{CRC-L}(D) = D^L + \ldots + 1$. A generation formula of the CRC code is $R_L(D) = D^L B(D) \mod g_{CRC-L}(D)$. A sequence representation manner of the generated CRC code is $(p_0, p_1, p_2, p_3, \ldots, p_{L-1})$.

S103: Generate second information, where the second information includes the first information and the CRC code.

For example, CRC encoding is performed on the first information based on the generated CRC code, to generate the second information. The second information is obtained by attaching the generated CRC code to an end of a sequence of the first information, a sequence representation manner of the second information is $(a_0, a_1, a_2, a_3, \ldots, a_{A-1}, p_0, p_1, p_2, p_3, \ldots, p_{L-1})$, and a length of the second information is A+L bits.

A generation process of the second information may be represented by the following formula: If the second information is represented by $(b_0, b_1, b_2, b_3, \ldots, b_{B-1})$ where B=A+L, when $0 \leq k \leq A-1$ and k is an integer, a data bit of the second information is $b_k = a_k$; and when $A \leq k \leq A+L-1$, a data bit of the second information is $b_k = p_{k-A}$. The finally obtained second information is $(a_0, a_1, a_2, a_3, \ldots, a_{A-1}, p_0, p_1, p_2, p_3, \ldots, p_{L-1})$.

S104: Send the second information.

For example, the transmit end sends the second information. Optionally, before sending the second information, the transmit end may perform code modulation on the second information and then send the second information.

Based on the information sending method provided in this embodiment, the length of the CRC code is determined based on the length of the first information, where the first information is the control information, and if the length of the first information is less than or equal to the first threshold, it is determined that the length of the CRC code is the first length, or if the length of the first information is less than or equal to the first threshold and greater than the second threshold, it is determined that the length of the CRC code is the first length; the CRC code is generated based on the generator polynomial corresponding to the length of the CRC code and the first information; the second information is generated, where the second information includes the first information and the CRC code; and the second information is sent. It may be learned that in this embodiment, the length of the CRC code for performing CRC encoding is determined based on a length of the control information, and the length of the CRC code is determined by comparing the length of the first information with a value of the first threshold or by comparing the length of the first information with values of the first threshold and the second threshold, thereby avoiding a possibility that an error occurs in information transmission even though a CRC check succeeds after a receive end receives information, and improving reliability of information transmission.

Further, in the foregoing embodiment, the determining a length of a CRC code based on a length of first information further includes: if the length of the first information is greater than the first threshold, determining that the length of the CRC code is a second length, where a value of the second length is greater than a value of the first length. Specifically, for example, the value of the second length may be 16 bits, and the value of the first length may be 8 bits. In this case, the first threshold is less than or equal to 119. For example, the first threshold is set to 119. If the length of the first information is greater than 119, it is determined that the length of the CRC code is the second length, namely, 16 bits. If the length of the first information is greater than the first threshold, it is determined that the length of the CRC code is the second length. This improves reliability of information transmission.

It should be noted that in the foregoing embodiment, the determining a length of a CRC code based on a length of first information may further include the following implementations: if the length of the first information is less than a first threshold, determining that the length of the CRC code is a first length, or if the length of the first information is less than a first threshold and greater than a second threshold, determining that the length of the CRC code is a first length; or if the length of the first information is greater than or equal to a first threshold, determining that the length of the CRC code is a second length, where a value of the second length is greater than a value of the first length. The first threshold is less than or equal to $2^{L-1}-L$. For example, when the first length is 8 bits, and the second length is 12 bits, the first threshold is less than or equal to 120, and when the first threshold is set to 120, if the length of the first information is less than 120, it is determined that the length of the CRC code is the first length, namely, 8 bits.

Optionally, the second length and a maximum length of the first information satisfy $2^{L_1-1}-1-L_1=MAX$, where MAX is the maximum length of the first information, and $L_1$ is the first length.

Further, in the foregoing embodiment, the first information is uplink control signaling, and includes any one or any combination of the following: hybrid automatic repeat request-acknowledgment (HARQ-ACK for short) signaling, an uplink scheduling request indicator (SRI for short), and channel state information (CSI for short). The CSI may include a precoding matrix indicator (PMI for short), a channel quality indicator (CQI for short), a rank indicator (RI for short), or a precoding type indicator (PTI for short). The PMI may be a broadband PMI or a subband PMI. The CQI may be a broadband CQI, a subband CQI, or a beam index (BI for short).

The method in the foregoing embodiment may be applied to a scenario in which the UE feeds back HARQ-ACK signaling to the eNB in frequency division duplex (FDD for short) or time division duplex (TDD for short) in an LTE system, or may be applied to a device-to-device (D2D for short) communications system. When a hybrid automatic repeat request (for short) technology is used, after the UE receives information on a physical downlink shared channel (PDSCH for short), if the information is correctly received, the UE sends acknowledgment (ACK for short) information on a physical uplink control channel (PUCCH for short), and if the information is incorrectly received, the UE sends negative acknowledgment (NACK for short) information. In a carrier aggregation (CA for short) scenario, the eNB configures a plurality of carriers for one UE to improve a data rate of the UE. In this case, the UE feeds back HARQ-ACKs for the plurality of carriers to the eNB.

The method in the foregoing embodiment may alternatively be used by the UE to report CSI signaling on each carrier to the eNB, and CSI reporting is classified into periodic CSI and aperiodic CSI. The periodic CSI is sent on a PUCCH; and the aperiodic CSI is sent on a physical uplink shared channel (PUSCH for short).

When the first information is uplink control signaling, the first length is set to 8 bits, the second length is 16 bits, and the first threshold is 119. To reduce complexity of implementation of the foregoing embodiment, an existing generator polynomial of the CRC code in the LTE system is used. A generator polynomial corresponding to a 16-bit CRC code is $g_{CRC16}(D)=D^{16}+D^{12}+D^5+1$, and a generator polynomial corresponding to an 8-bit CRC code is $g_{CRC8}(D)=D^8+D^7+D^4+D^3+D+1$.

If the first information is a HARQ-ACK and an SRI that are transmitted simultaneously or a HARQ-ACK that is transmitted separately, when the length of the first information is greater than 119, the first information is encoded using the generator polynomial $g_{CRC16}(d)=d^{16}+D^{12}+D^5+1$ corresponding to the 16-bit CRC code. When the length of the first information is less than or equal to 119, the first information is encoded using the generator polynomial $g_{CRC8}(D)=D^8+D^7+D^4+D^3+D+1$ corresponding to the 8-bit CRC code.

If the first information is a HARQ-ACK and an SRI that are transmitted simultaneously or a HARQ-ACK that is transmitted separately: the second threshold is set to 22. When the length of the first information is greater than 119, the first information is encoded using the generator polynomial corresponding to the 16-bit CRC code. When the length of the first information is greater than 22 and less than or equal to 119, the first information is encoded using the generator polynomial corresponding to the 8-bit CRC code. Optionally, when the length of the first information is less than or equal to 22, CRC encoding is not performed on the first information.

If the first information is periodic CSI, the second threshold is set to 11. When the length of the first information is greater than 119, the first information is encoded using the generator polynomial corresponding to the 16-bit CRC code. When the length of the first information is greater than 11 and less than or equal to 119, the first information is encoded using the generator polynomial corresponding to the 8-bit CRC code. Optionally, when the length of the first information is less than or equal to 11, CRC encoding is not performed on the first information.

If the first information is aperiodic CSI, in an implementation, when the length of the first information is greater than 119, the first information is encoded using the generator polynomial corresponding to the 16-bit CRC code. When the length of the first information is less than or equal to 119, the first information is encoded using the generator polynomial corresponding to the 8-bit CRC code. In another implementation, when the length of the first information is greater than 360, the first information is encoded using the generator polynomial corresponding to the 16-bit CRC code. When the length of the first information is less than or equal to 360, the first information is encoded using the generator polynomial corresponding to the 8-bit CRC code.

If the first information is a HARQ-ACK, an SRI, and CSI that are simultaneously transmitted, when the length of the first information is greater than 119, the first information is encoded using the generator polynomial corresponding to the 16-bit CRC code. When the length of the first information is less than or equal to 119, the first information is encoded using the generator polynomial corresponding to the 8-bit CRC code.

When the first information is uplink control signaling, the foregoing implementation is used, so as to improve reliability of information transmission and lower communication costs.

Figure 2:
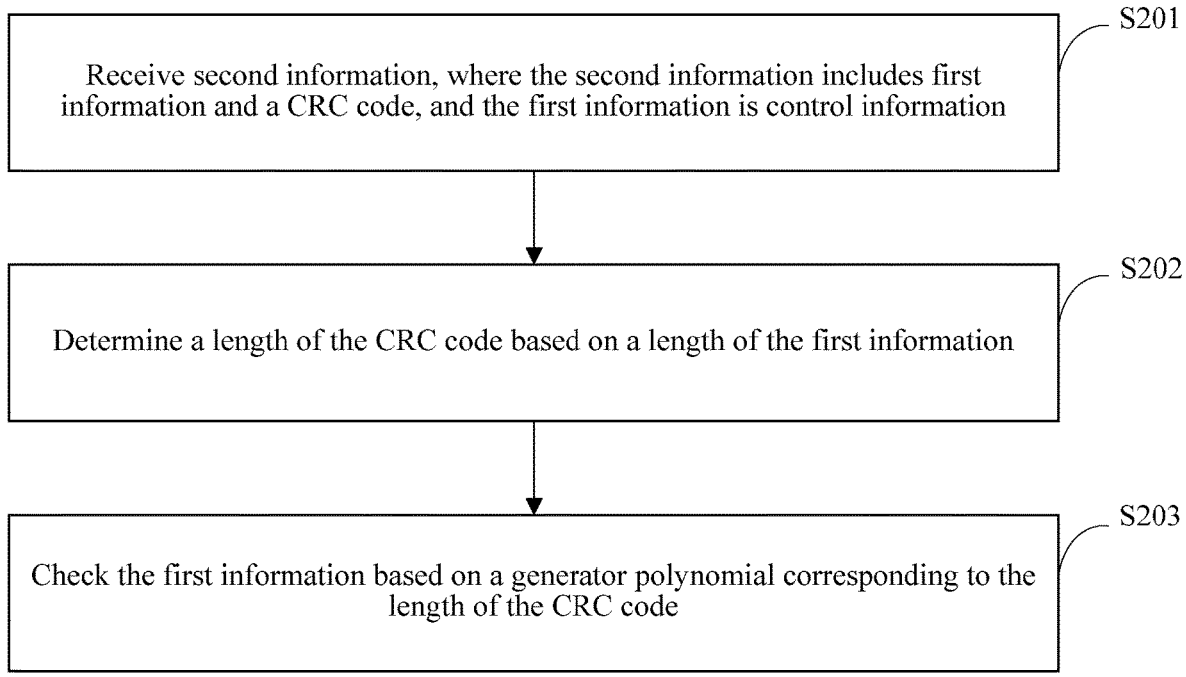
FIG. 2 is a schematic flowchart of an embodiment of an information receiving method according to the embodiments of the present invention.

FIG. 2 is a schematic flowchart of an embodiment of an information receiving method according to the embodiments of the present invention. As shown in FIG. 2, the information receiving method according to this embodiment includes the following steps.

S201: Receive second information, where the second information includes first information and a CRC code, and the first information is control information.

For example, this embodiment is performed by an information receive end. If the method is used in an uplink information receiving process, the method may be performed by a base station or another network element device. If the method is used in a downlink information receiving process, the method may be performed by a UE or another terminal. The second information includes the first information and the CRC code. The first information is the control information. Optionally, after the receiving the second information, the information receive end first performs demodulation on the second information.

S202: Determine a length of the CRC code based on a length of the first information.

If the length of the first information is less than or equal to a first threshold, it is determined that the length of the CRC code is a first length, or if the length of the first information is less than or equal to a first threshold and greater than a second threshold, it is determined that the length of the CRC code is a first length.

For example, the length of the first information may be determined according to a rule agreed between a transmit end and the receive end, or may be determined by the receive end based on an air interface resource, or through a notification or in another manner capable of making a transmit end and the receive end learn of the length of the first information in a transmission process. Alternatively, the length of the first information may be determined by the receive end, and the transmit end is notified of a length of to-be-sent information using control signaling, so that the transmit end selects a CRC code corresponding to the length of the information to attach the CRC code. In this way, because the receive end has learned of the length of the first information, when receiving the second information, the receive end can directly determine a length of the CRC code using the length of the first information that the receive end has learned of. This is not limited in the present invention provided that the length of the first information determined by the transmit end is the same as the length of the first information determined by the receive end.

In an implementation, the determining, by a receive end, a length of the CRC code based on a length of the first information includes: if the length of the first information is less than or equal to the first threshold, determining that the length of the CRC code is the first length. In another implementation, the determining, by a receive end, a length of the CRC code based on a length of the first information includes: if the length of the first information is less than or equal to the first threshold and greater than the second threshold, determining that the length of the CRC code is the first length.

In either of the foregoing implementations, the first length satisfies $2^{L-1}-1-L \geq A$, where L is the first length, and A is the length of the first information. For example, the first length is 8 bits, and the first threshold is 119 bits. In this case, if the length of the first information is less than or equal to 119, it is determined that the length of the CRC code is the first length, namely, 8 bits.

The first threshold is less than or equal to $2^{L-1}-1-L$, and L is the first length. For example, when the first length is 8 bits, the first threshold is less than or equal to 119, that is, the first threshold may be 119 or any value less than 119. The first threshold is preset or received in advance. For example, the first threshold may be preset by the information transmit end and the information receive end, or may be received by the transmit end in advance from the receive end, or may be received by the transmit end and the receive end in advance from another network element.

The second threshold is preset or received in advance. For example, the second threshold may be preset by the information transmit end and the information receive end, or may be received by the transmit end in advance from the receive end, or may be received by the transmit end and the receive end in advance from another network element. Optionally, a value of the second threshold may be determined based on some existing values. For example, the value of the second threshold may be selected as 22 in consideration of not affecting a largest quantity of bits supported by an existing protocol such as a physical uplink control channel (PUCCH for short) format. That is, the first length is 8 bits, and the first threshold is 119. In this case, if the length of the first information is less than or equal to 119 and greater than 22, the first information is encoded using the CRC code having the first length, namely, 8 bits.

In another implementation, before the determining, based on a length of the first information, a length that is of the CRC code and that corresponds to the length of first information, the method further includes: determining the length of the first information based on a length of the second information. For example, the length of the first information is determined using a total length of the second information and a correspondence between the length of first information and the length of the CRC code.

S203: Check the first information based on a generator polynomial corresponding to the length of the CRC code.

For example, if the length of the CRC code is determined, the first information is checked by selecting the generator polynomial corresponding to the length of the CRC code. It should be noted that the generator polynomial of the CRC code is agreed between the information transmit end and the information receive end in advance. A modulo-2 division operation is performed on the second information and the generator polynomial of the corresponding CRC code. If a remainder is 0, a CRC check succeeds, and the first information is correctly transmitted. If a remainder is not 0, a CRC check fails, and the first information is incorrectly transmitted.

Based on the information receiving method provided in this embodiment, the second information is received, where the second information includes the first information and the CRC code, and the first information is the control information; the length of the CRC code is determined based on the length of the first information, where if the length of the first information is less than or equal to the first threshold, it is determined that the length of the CRC code is the first length, or if the length of the first information is less than or equal to the first threshold and greater than the second threshold, it is determined that the length of the CRC code is the first length; and the first information is checked based on the generator polynomial corresponding to the length of the CRC code. It may be learned that in this embodiment, the length for performing CRC encoding is determined based on the length of the first information, thereby avoiding a possibility that an error occurs in information transmission even though a CRC check succeeds after a receive end receives information, and improving reliability of information transmission.

Further, in the foregoing embodiment, the determining a length of the CRC code based on a length of the first information includes: if the length of the first information is greater than the first threshold, determining that the length of the CRC code is a second length, where a value of the second length is greater than a value of the first length. For example, for example, the value of the second length may be 16 bits, and the value of the first length may be 8 bits. In this case, the first threshold is less than or equal to 119. For example, the first threshold is set to 119. If the length of the first information is greater than 119, it is determined that the length of the CRC code is the second length, namely, 16 bits. If the length of the first information is greater than the first threshold, it is determined that the length of the CRC code is the second length. This improves reliability of information transmission.

Further, in the foregoing embodiment, the first information is uplink control signaling, and includes any one or any combination of the following: a HARQ-ACK, an SRI, and CSI. The CSI may include a PMI, a CQI, an RI, or a PTI. The PMI may be a broadband PMI or a subband PMI. The CQI may be a broadband CQI, a subband CQI, or a beam index BI.

Figure 3:
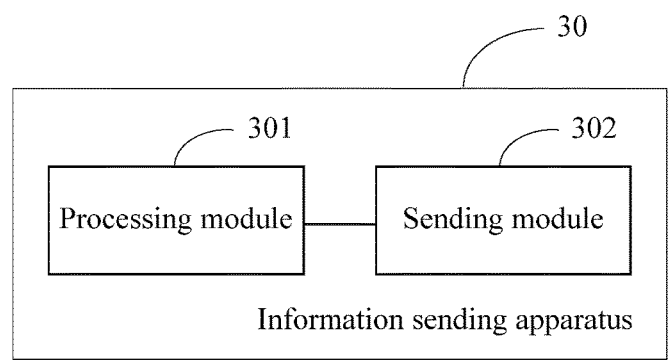
FIG. 3 is a schematic structural diagram of an embodiment of an information sending apparatus according to the embodiments of the present invention.

FIG. 3 is a schematic structural diagram of an embodiment of an information sending apparatus according to the embodiments of the present invention. As shown in FIG. 3, the information sending apparatus 30 according to this embodiment includes a processing module 301 and a sending module 302.

The processing module 301 is configured to determine a length of a CRC code based on a length of first information.

The first information is control information. If the length of the first information is less than or equal to a first threshold, it is determined that the length of the CRC code is a first length, or if the length of the first information is less than or equal to a first threshold and greater than a second threshold, it is determined that the length of the CRC code is a first length.

The processing module 301 is further configured to generate the CRC code based on a generator polynomial corresponding to the length of the CRC code and the first information.

The processing module 301 is further configured to generate second information, where the second information includes the first information and the CRC code.

The sending module 302 is configured to send the second information generated by the processing module 301.

For example, the first length satisfies $2^{L-1}-1-L \geq A$, where L is the first length, and A is the length of the first information. The first length is 8 bits, and the first threshold is 119 bits.

The first threshold is less than or equal to $2^{L-1}-1-L$, and L is the first length. The first threshold is preset or received in advance. If the first length is 8 bits, the first threshold is less than or equal to 119.

The second threshold is preset or received in advance. For example, the second threshold may be 22.

The processing module 301 is further configured to: if the length of the first information is greater than the first threshold, determine that the length of the CRC code is a second length, where a value of the second length is greater than a value of the first length. The second length is 16 bits.

The apparatus provided in this embodiment may be correspondingly used to perform the technical solution of the method embodiment shown in FIG. 1, and their implementation principles are similar. Details are not described herein again.

Based on the information transmission apparatus provided in this embodiment, the processing module is configured to: determine the length of the CRC code based on the length of the first information, where the first information is the control information, if the length of the first information is less than or equal to the first threshold, it is determined that the length of the CRC code is the first length, or if the length of the first information is less than or equal to the first threshold and greater than the second threshold, it is determined that the length of the CRC code is the first length; generate the CRC code based on the generator polynomial corresponding to the length of the CRC code and the first information; and generate the second information, where the second information includes the first information and the CRC code. The sending module is configured to send the second information generated by the processing module. It may be learned that in this embodiment, the length of the CRC code for performing CRC encoding is determined based on the length of the control information, thereby avoiding a possibility that an error occurs in information transmission even though a CRC check succeeds after the receiving apparatus receives information, and improving reliability of information transmission.

Further, in the foregoing embodiment, the first information is uplink control signaling, and includes any one or any combination of the following: a HARQ-ACK, an SRI, and CSI. The CSI may include a PMI, a CQI, an RI, or a PTI. The PMI may be a broadband PMI or a subband PMI. The CQI may be a broadband CQI, a subband CQI, or a beam index BI.

Figure 4:
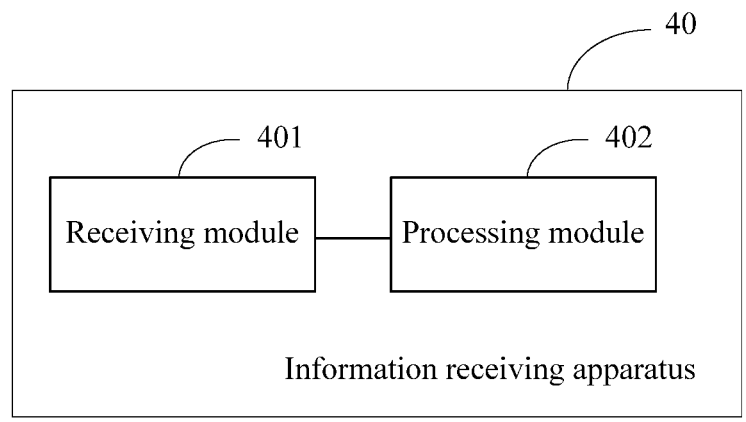
FIG. 4 is a schematic structural diagram of an embodiment of an information receiving apparatus according to the embodiments of the present invention.

FIG. 4 is a schematic structural diagram of an embodiment of an information receiving apparatus according to the embodiments of the present invention. As shown in FIG. 4, the information receiving apparatus 40 according to this embodiment includes a receiving module 401 and a processing module 402.

The receiving module 401 is configured to receive second information. The second information includes first information and a CRC code, and the first information is control information.

The processing module 402 is configured to determine a length of the CRC code based on a length of the first information in the second information received by the receiving module 401. If the length of the first information is less than or equal to a first threshold, it is determined that the length of the CRC is a first length, or if the length of the first information is less than or equal to the first threshold and greater than a second threshold, it is determined that the length of the CRC is a first length. The processing module 402 is further configured to check the first information based on a generator polynomial corresponding to the length of the CRC code.

The processing module 402 is further configured to check the first information based on a generator polynomial corresponding to the length of the CRC code.

Specifically, the first length satisfies $2^{L-1}-1-L \leq A$, where L is the first length, and A is the length of the first information. The first length is 8 bits, and the first threshold is 119 bits.

The first threshold is less than or equal to $2^{L-1}-1-L$, and L is the first length. The first threshold is preset or received in advance. If the first length is 8 bits, the first threshold is less than or equal to 119.

The second threshold is preset or received in advance. For example, the second threshold may be 22.

The processing module 402 is further configured to: if the length of the first information is greater than the first threshold, determine that the length of the CRC code is a second length, where a value of the second length is greater than a value of the first length. The second length is 16 bits.

The apparatus provided in this embodiment may be used to perform the technical solution of the method embodiment shown in FIG. 2, and their implementation principles are similar. Details are not described herein again.

Based on the information receiving method provided in this embodiment, the receiving module is configured to receive the second information. The second information includes the first information and the CRC code, and the first information is the control information. The processing module is configured to determine the length of the CRC code based on the length of the first information. If the length of the first information is less than or equal to the first threshold, it is determined that the length of the CRC code is the first length, or if the length of the first information is less than or equal to the first threshold and greater than the second threshold, it is determined that the length of the CRC code is the first length. The processing module is further configured to check the first information based on the generator polynomial corresponding to the length of the CRC code. It may be learned that in this embodiment, the length for performing CRC encoding is determined based on the length of the first information, thereby avoiding a possibility that an error occurs in information transmission even though a CRC check succeeds after a receive end receives information, and improving reliability of information transmission.

Further, in the foregoing embodiment, the first information is uplink control signaling, and includes any one or any combination of the following: a HARQ-ACK, an SRI, and CSI. The CSI may include a PMI, a CQI, an RI, or a PTI. The PMI may be a broadband PMI or a subband PMI. The CQI may be a broadband CQI, a subband CQI, or a beam index BI.

Figure 5:
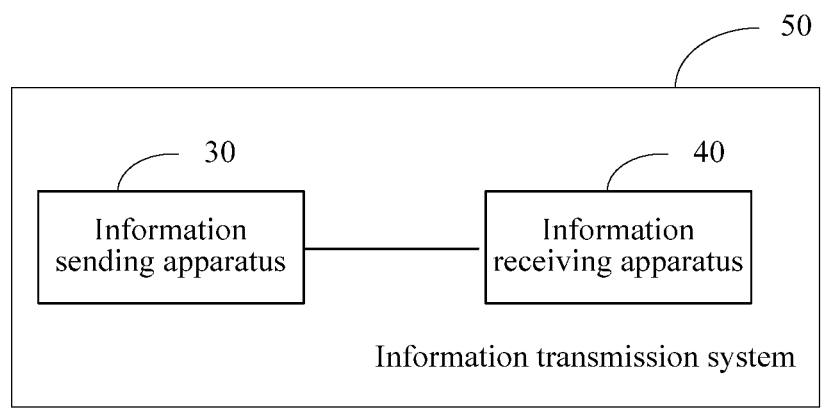
FIG. 5 is a schematic structural diagram of an embodiment of an information transmission system according to the embodiments of the present invention.

FIG. 5 is a schematic structural diagram of an embodiment of an information transmission system according to the embodiments of the present invention. As shown in FIG. 5, the information transmission system 50 according to this embodiment includes:

the information sending apparatus 30 shown in FIG. 3 and the information receiving apparatus 40 shown in FIG. 4.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes any medium that can store program code, such as a ROM, a RAM, a magnetic disk, or an optical disc.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A method comprising:
    determining a length of a cyclic redundancy check (CRC) code based on a length of first information, wherein the first information is control information, and when the length of the first information is less than or equal to a first threshold and greater than a second threshold, the length of the CRC code is a first length, wherein the first threshold is less than or equal to $2^{L-1}-1-L$, and L is the first length;
    generating the CRC code based on a generator polynomial corresponding to the length of the CRC code and the first information;
    generating second information, wherein the second information comprises the first information and the CRC code; and
    sending the second information.
2. The method according to claim 1, wherein the first threshold is preset.

3. The method according to claim 1, wherein
if the length of the first information is greater than the first threshold, the length of the CRC code is a second length, wherein a value of the second length is greater than a value of the first length.

4. The method according to claim 3, wherein the second length is 16 bits.

5. The method according to claim 1, wherein the second threshold is preset.

6. The method according to claim 5, wherein the second threshold is 11 bits.

7. The method according to claim 1, wherein the first information comprises any one or any combination of the following:
hybrid automatic repeat request-acknowledgment (HARQ-ACK) signaling;
an uplink scheduling request indicator (SRI); and
channel state information (CSI).

8. An apparatus comprising:
a storage medium including executable instructions; and
a processor;
wherein the executable instructions, when executed by the processor, cause the apparatus to:
determine a length of a cyclic redundancy check (CRC) code based on a length of first information, wherein the first information is control information, and if the length of the first information is less than or equal to a first threshold, the length of the CRC code is a first length, or if the length of the first information is less than or equal to the first threshold and greater than a second threshold, the length of the CRC code is the first length, wherein the first threshold is less than or equal to $2^{L-1}-1-L$, and L is the first length;
generate the CRC code based on a generator polynomial corresponding to the length of the CRC code and the first information;
generate second information, wherein the second information comprises the first information and the CRC code; and
send the second information.

9. The apparatus according to claim 8, wherein the first threshold is preset.

10. The apparatus according to claim 8, wherein
if the length of the first information is greater than the first threshold, the length of the CRC code is a second length, wherein a value of the second length is greater than a value of the first length.

11. The apparatus according to claim 8, wherein the second threshold is preset.

12. The apparatus according to claim 8, wherein the second threshold is 11 bits.

13. The apparatus according to claim 8, wherein the first information comprises any one or any combination of the following:
hybrid automatic repeat request-acknowledgment (HARQ-ACK) signaling;
an uplink scheduling request indicator (SRI); and
channel state information (CSI).

14. A non-transitory computer-readable storage medium comprising instructions which, when executed by a computer, cause the computer to carry out the operations of:
determining a length of a cyclic redundancy check (CRC) code based on a length of first information, wherein the first information is control information, and if the length of the first information is less than or equal to a first threshold, the length of the CRC code is a first length, or if the length of the first information is less than or equal to the first threshold and greater than a second threshold, the length of the CRC code is the first length, wherein the first threshold is less than or equal to $2^{L-1}-1-L$, and L is the first length;
generating the CRC code based on a generator polynomial corresponding to the length of the CRC code and the first information;
generating second information, wherein the second information comprises the first information and the CRC code; and
sending the second information.

15. The non-transitory computer-readable storage medium according to claim 14, wherein the first threshold is preset.

16. The non-transitory computer-readable storage medium according to claim 14, wherein
if the length of the first information is greater than the first threshold, the length of the CRC code is a second length, wherein a value of the second length is greater than a value of the first length.

17. The non-transitory computer-readable storage medium according to claim 14, wherein the second threshold is preset.

18. The non-transitory computer-readable storage medium according to claim 14, wherein the second threshold is 11 bits.

19. The non-transitory computer-readable storage medium according to claim 14, wherein the first information comprises any one or any combination of the following:
hybrid automatic repeat request-acknowledgment (HARQ-ACK) signaling;
an uplink scheduling request indicator (SRI); and
channel state information (CSI).

* * * * *